US009253586B2

(12) United States Patent  (10) Patent No.: US 9,253,586 B2
Nystrom et al.  (45) Date of Patent: Feb. 2, 2016

(54) DEVICES, METHODS AND COMPUTER PROGRAM PRODUCTS FOR CONTROLLING LOUDNESS

(71) Applicant: Sony Corporation, Tokyo (JP)

(72) Inventors: Martin Nystrom, Horja (SE); Sead Smailagic, Helsingborg (SE)

(73) Assignee: Sony Corporation, Tokyo (JP)

( * ) Notice: Subject to any disclaimer, the term of this patent is extended or adjusted under 35 U.S.C. 154(b) by 355 days.

(21) Appl. No.: 13/871,260

(22) Filed: Apr. 26, 2013

(65) Prior Publication Data

US 2014/0321670 A1  Oct. 30, 2014

(51) Int. Cl.
*H03G 5/00* (2006.01)
*H03B 9/00* (2006.01)
*H03G 3/00* (2006.01)
*H04S 7/00* (2006.01)
*H03G 5/16* (2006.01)
*H03G 3/20* (2006.01)

(52) U.S. Cl.
CPC .............. *H04S 7/307* (2013.01); *H03G 5/165* (2013.01); *G10H 2250/161* (2013.01); *H03G 3/20* (2013.01)

(58) Field of Classification Search
CPC ....... H03G 3/3005; H03G 7/00; H03G 7/007; H03G 5/165; H03G 3/20; G10H 2250/161; H04S 7/307
USPC .................................. 381/107, 104, 101, 102
See application file for complete search history.

(56) References Cited

U.S. PATENT DOCUMENTS

| | | | | |
|---|---|---|---|---|
| 5,018,205 | A | * | 5/1991 | Takagi et al. .................... 381/86 |
| 6,094,489 | A | * | 7/2000 | Ishige et al. .................... 381/60 |
| 8,059,833 | B2 | | 11/2011 | Koh et al. |
| 8,135,146 | B2 | | 3/2012 | Kwon |
| 2009/0232329 | A1 | * | 9/2009 | Kwon ........................... 381/103 |
| 2012/0063616 | A1 | * | 3/2012 | Walsh et al. .................. 381/103 |
| 2012/0163629 | A1 | | 6/2012 | Seefeldt |

(Continued)

FOREIGN PATENT DOCUMENTS

EP  1 677 574 A2  7/2006
EP  1 705 950 A2  9/2006

(Continued)

OTHER PUBLICATIONS

Extended European Search Report Corresponding to European Patent Application No. 14160666.5; Dated: Feb. 17, 2015; 4 Pages.

*Primary Examiner* — Vivian Chin
*Assistant Examiner* — Douglas Suthers
(74) *Attorney, Agent, or Firm* — Myers Bigel Sibley & Sajovec, PA

(57) ABSTRACT

A method by an electronic device for controlling a frequency response of audio output includes: receiving an audio signal at the device; estimating a sound pressure level of the audio signal based on one or more attributes or settings of the electronic device and/or the audio signal; generating values of an adaptive loudness control curve along a range of frequencies, wherein the adaptive loudness control curve is generated based on a difference between values of an equal loudness curve at the estimated sound pressure level along and values of an equal loudness curve at a reference sound pressure level; filtering the audio signal using values of the adaptive loudness control curve; and controlling output of the filtered audio signal as an audio output having substantially the same loudness along the range of frequencies.

20 Claims, 6 Drawing Sheets

(56) References Cited

U.S. PATENT DOCUMENTS

2012/0250895 A1 10/2012 Katsianos
2013/0044888 A1 2/2013 Nystrom et al.

FOREIGN PATENT DOCUMENTS

WO WO 2011/019339 A1 2/2011
WO WO 2013/021225 A1 2/2013

* cited by examiner

DEVICES, METHODS AND COMPUTER PROGRAM PRODUCTS FOR CONTROLLING LOUDNESS

BACKGROUND

It is desirable to achieve a flat frequency response in equipment used for reproduction of music. A flat frequency response facilitates a proper tonal balance (i.e., the balance or volume relationships between different regions of the frequency spectrum, including bass, lower midrange, midrange, upper midrange and highs).

Human hearing is non-linear. That is, humans perceive sound pressure levels differently for different frequencies. The non-linearity is also dependent on sound pressure levels. Therefore, a human hears a different tonal balance for the same piece of music when the volume level is changed. Generally speaking, at lower volume levels, low frequencies are quite attenuated and high frequencies are somewhat less attenuated.

It is known to provide a loudness button or control on an audio device such as an amplifier. The loudness control activates a filter lifting low and high frequencies to some fixed chosen loudness setting.

However, the nature of loudness is continuous, so any chosen setting is only accurate for a particular sound pressure level. Sound pressure level is dependent on a variety of factors, including volume setting, electronic attributes, recording content and level, and so forth.

SUMMARY

According to a first aspect, embodiments of the invention are directed to a method by an electronic device for controlling a frequency response of audio output. The method includes: receiving an audio signal at the device; estimating a sound pressure level of the audio signal based on one or more attributes or settings of the electronic device and/or the audio signal; generating values of an adaptive loudness control curve along a range of frequencies, wherein the adaptive loudness control curve is generated based on a difference between values of an equal loudness curve at the estimated sound pressure level along the range of frequencies and values of an equal loudness curve at a reference sound pressure level along the range of frequencies; filtering the audio signal using values of the adaptive loudness control curve; and controlling output of the filtered audio signal as an audio output having substantially the same loudness along the range of frequencies.

Values of the equal loudness curve at the estimated sound pressure level and values of the equal loudness curve at the reference sound pressure level may be values of equal loudness curves according to ISO 226:2003. In some embodiments, the method includes controlling the output of the filtered audio signal as an audio output having substantially the same loudness along the range of frequencies independent of volume level. In some embodiments, the method includes controlling the output of the filtered audio signal as an audio output having substantially the same loudness along the range of frequencies independent of a level of content of the audio signal. In some embodiments, the method includes: generating a set of filter coefficients based on values of the adaptive loudness control curve; and filtering the audio signal according to the generated set of filter coefficients.

The one or more attributes or settings of the electronic device and/or the audio signal may include a volume setting that controls operation of the electronic device. In some embodiments, the method includes determining a transducer factor associated with digital to analog conversion of the audio signal following the filtering, and the one or more attributes or settings of the electronic device and/or the audio signal may include the determined transducer factor.

In some embodiments, the method includes determining a gain that controls operation of at least one component of the electronic device, and the one or more attributes or settings of the electronic device and/or the audio signal may include the determined gain of the at least one component of the electronic device. The at least one component of the electronic device may include at least one of an amplifier, a digital to analog converter, a processor, a filter and a loudspeaker.

The one or more attributes or settings of the electronic device and/or the audio signal may include a level of the audio signal. The audio signal may be a received or recorded signal, and the method may further include analyzing the received or recorded signal to obtain a time based average audio input as the level of the audio signal.

The one or more attributes or settings of the electronic device and/or the audio signal may include an efficiency of a loudspeaker of the electronic device. The one or more attributes or settings of the electronic device and/or the audio signal may include characteristics of a microphone signal.

In some embodiments, the reference sound pressure level is between about 90 dB and 100 dB. In some embodiments, the audio signal comprises a recording, and the reference sound pressure level is the actual sound pressure level at the recording.

According to a second aspect, embodiments of the invention are directed to an electronic device. The device includes an audio source and at least one processor. The at least one processor is configured to: receive an audio signal from the audio source; estimate a sound pressure level of the audio signal based on one or more attributes or settings of the electronic device and/or the audio signal; and generate values of an adaptive loudness control curve along a range of frequencies, wherein the adaptive loudness control curve is generated based on a difference between values of an equal loudness curve at the estimated sound pressure level along the range of frequencies and values of an equal loudness curve at a reference sound pressure level along the range of frequencies.

In some embodiments, the device includes a loudspeaker, and the at least one processor is configured to adaptively filter the audio signal using values of the generated adaptive loudness control curve, and the loudspeaker is configured to output the filtered audio signal as an audio output having substantially the same loudness along the range of frequencies.

In some embodiments, the device includes a filter and a loudspeaker, and the filter is configured to receive the audio signal and filter the audio signal using values of the generated adaptive loudness control curve, and the loudspeaker is configured to output the filtered audio signal as an audio output having substantially the same loudness along the range of frequencies.

In some embodiments, the device includes a loudspeaker, and the at least one processor is configured to electronically process the audio signal using a set of parameters that include electronic frequency response correction that is based on values of the generated adaptive loudness control curve to provide an audio drive signal to the loudspeaker.

In some embodiments, the device is a wireless communications terminal.

According to a third aspect, embodiments of the invention are directed to a computer program product for controlling frequency response for audio output by an electronic device, the computer program product comprising a non-transitory computer readable storage medium having encoded thereon instructions that, when executed on a computer, cause the computer to: estimate a sound pressure level associated with an audio signal received at the electronic device based on one or more attributes or settings of the electronic device and/or the audio signal; generate values of an adaptive loudness control curve along a range of frequencies, wherein the adaptive loudness control curve is generated based on a difference between values of an equal loudness curve at the estimated sound pressure level along the range of frequencies and values of an equal loudness curve at a reference sound pressure level along the range of frequencies; filter the audio signal using the adaptive loudness control curve; and control output of the filtered audio signal as an audio output having substantially the same loudness along the range of frequencies.

It is noted that any one or more aspects or features described with respect to one embodiment may be incorporated in a different embodiment although not specifically described relative thereto. That is, all embodiments and/or features of any embodiment can be combined in any way and/or combination. Applicant reserves the right to change any originally filed claim or file any new claim accordingly, including the right to be able to amend any originally filed claim to depend from and/or incorporate any feature of any other claim although not originally claimed in that manner. These and other objects and/or aspects of the present invention are explained in detail in the specification set forth below.

Further features, advantages and details of the present invention will be appreciated by those of ordinary skill in the art from a reading of the figures and the detailed description of the preferred embodiments that follow, such description being merely illustrative of the present invention.

DETAILED DESCRIPTION OF EMBODIMENTS OF THE INVENTION

Figure 1:
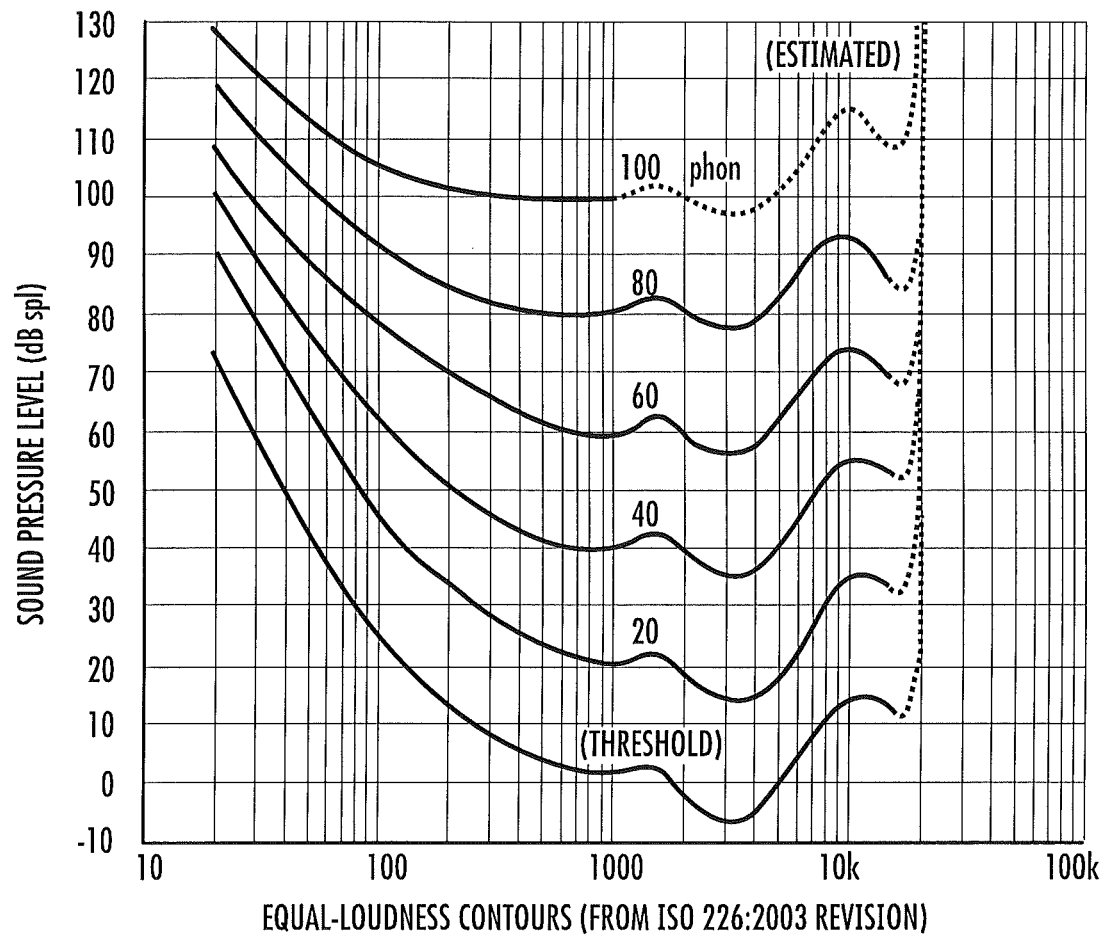
FIG. 1 is a chart showing equal loudness contours of ISO 226:2003. The horizontal scale is frequency in Hertz (logarithmic base 10 scale) and the vertical scale is level in decibels.

Various embodiments of the present invention will now be described more fully hereinafter with reference to the accompanying drawings. However, this invention should not be construed as limited to the embodiments set forth herein. Rather, these embodiments are provided so that this disclosure will be thorough and complete, and will convey the scope of the invention to those skilled in the art.

It will be understood that, as used herein, the term "comprising" or "comprises" is open-ended, and includes one or more stated elements, steps and/or functions without precluding one or more unstated elements, steps and/or functions. As used herein, the singular forms "a," "an" and "the" are intended to include the plural forms as well, unless the context clearly indicates otherwise. The term "and/or" and "/" includes any and all combinations of one or more of the associated listed items. In the drawings, the size and relative sizes of regions may be exaggerated for clarity. Like numbers refer to like elements throughout.

Some embodiments may be embodied in hardware and/or in software (including firmware, resident software, microcode, etc.). Consequently, as used herein, the term "signal" may take the form of a continuous waveform and/or discrete value(s), such as digital value(s) in a memory or register. Furthermore, various embodiments may take the form of a computer program product on a computer-usable or computer-readable storage medium having computer-usable or computer-readable program code embodied in the medium for use by or in connection with an instruction execution system. Accordingly, as used herein, the terms "circuit" and "controller" and "processor" may take the form of digital circuitry, such as computer-readable program code executed by an instruction processing device(s) (e.g., general purpose microprocessor and/or digital signal microprocessor), and/or analog circuitry. The operations that are described below with regard to the figures can therefore be at least partially implemented as computer-readable program code executed by a computer (e.g., microprocessor).

Embodiments are described below with reference to block diagrams and operational flow charts. It is to be understood that the functions/acts noted in the blocks may occur out of the order noted in the operational illustrations. For example, two blocks shown in succession may in fact be executed substantially concurrently or the blocks may sometimes be executed in the reverse order, depending upon the functionality/acts involved. Although some of the diagrams include arrows on communication paths to show a primary direction of communication, it is to be understood that communication may occur in the opposite direction to the depicted arrows.

Loudness may be measured in units of "phon," The loudness of a given sound in phon is the sound pressure level of a 1 kHz tone having a subjective loudness equal to that of the sound. However, perceived loudness varies with frequency, unlike sound pressure levels measured in decibels (dB).

FIG. 1 shows equal loudness curves or contours as set forth in the international standard ISO 226:2003 entitled "Acoustics—Normal equal-loudness-level contours." An equal-loudness contour or curve is a measure of sound pressure, over the frequency spectrum, for which a listener perceives a constant loudness.

While the phon measurement takes into account the varying sensitivity of human hearing with frequency, it does not allow the assessment of the relative subjective loudnesses of sounds at varying levels because there is no attempt to correct for the non-linearity of growth of the loudness with sound pressure level; that is, for the varying spacing of the contours.

The sensitivity of the human ear varies with both frequency and level. Therefore, the perceived spectrum or timbre of a given sound varies with the acoustic level at which the sound is heard. For example, for a sound containing low, middle and high frequencies, the perceived relative proportions of such frequency components change with the overall loudness of the sound; when it is quiet the low and high frequency components sound quieter relative to the middle frequencies than they sound when it is loud. As mentioned above, this phenomenon is known and has been mitigated to a certain degree in sound reproducing equipment by so-called loudness controls. A loudness control applies low- and sometimes also high-frequency boost as the volume is turned down. Thus, the lower sensitivity of the ear at the frequency extremes is compensated by an artificial boost of those frequencies. However, such controls are passive and may only provide adequate frequency response at one particular sound pressure level or volume.

Figure 2:
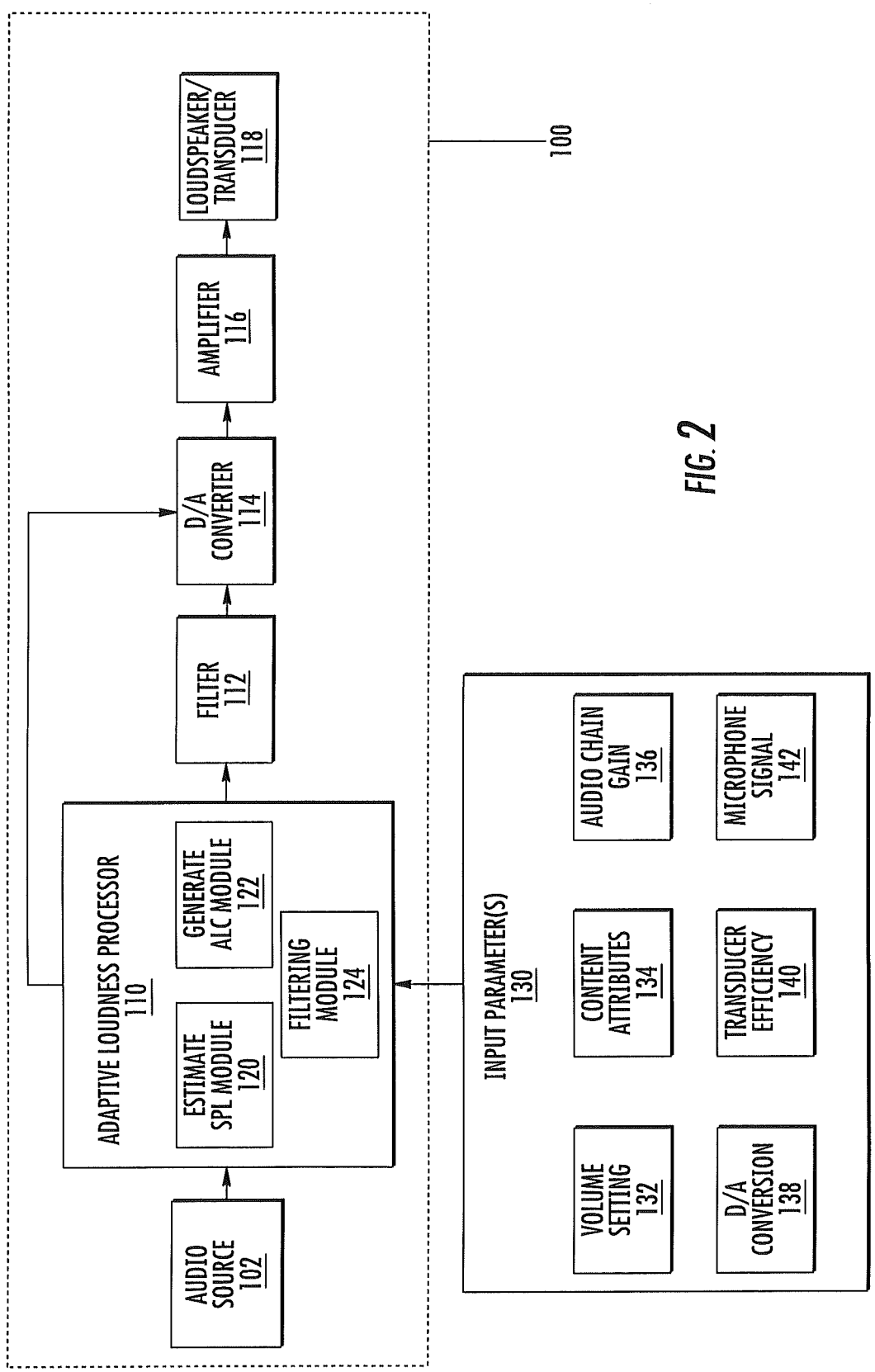
FIG. 2 is a block diagram of an electronic device according to some embodiments of the present invention.

An electronic device 100 according to some embodiments of the invention is illustrated in FIG. 2. The electronic device 100 includes an "audio chain," which may include an audio source 102, a filter 112, a digital-to-analog converter 114, an amplifier 116 and/or a loudspeaker or transducer 118. The loudspeaker 118 may be located outside the device 100 in some embodiments, with the device 100 (e.g., a controller or processor thereof) providing an audio drive signal to the external loudspeaker 118. It will be understood that one or more of the audio chain components shown in FIG. 2 may be omitted or rearranged.

In the illustrated embodiment, an adaptive loudness controller or processor 110 is disposed in the audio chain. The adaptive loudness processor 110 may also be referred to as an adaptive filtering controller or processor. The adaptive loudness processor 110 may be configured to receive an audio signal (e.g., an input audio signal) from the audio source 102. The audio signal may be from a recording such as an MP3 recording or may be a received signal such as an FM radio signal.

As illustrated in FIG. 2, the processor 110 includes a sound pressure level (SPL) estimation module 120. In some embodiments, the SPL estimation module 120 estimates a sound pressure level of the received audio signal based on one or more attributes or settings of the electronic device and/or the audio signal, also referred to herein as input parameters 130. In some embodiments, the SPL estimation module 120 may estimate the "actual" sound pressure level as it would be output from the loudspeaker 118 into the air, into a room, etc. (e.g., without any loudness control or filtering). In some embodiments, the SPL estimation module 120 continuously and/or dynamically estimates a sound pressure level of the received audio signal or the actual sound pressure level output.

The one or more attributes or settings of the electronic device and/or the audio signal based on which the sound pressure level is estimated may include a volume setting 132 of the electronic device 100, audio signal content attribute(s) 134, a gain of one or more components of the audio device or audio chain 136, attribute(s) of digital-to-analog conversion 138, an efficiency of a loudspeaker or transducer 140, and/or characteristics of a microphone signal 142. These various input parameters will be described in greater detail below.

Still referring to FIG. 2, the processor 110 includes an adaptive loudness control (ALC) curve calculation or generation module 122, The ALC curve generation module 122 is configured to generate adaptive loudness control curves (also referred to herein as "filter curves") including values of adaptive loudness control curves along a range of frequencies. In some embodiments, each adaptive loudness control curve is generated based on a difference between values of an equal loudness curve at the estimated sound pressure level (e.g., the sound pressure level estimated using the SPL estimation module 120) along the range of frequencies and values of an equal loudness curve at a reference sound pressure level along the range of frequencies. The equal loudness curves may be those shown in FIG. 1; that is, the frequency-dependent equal loudness contours or curves according to ISO 226:2003. It will be understood that equal loudness curves for other loudness levels not shown in FIG. 1 (e.g., 90 phon) may be known or calculated using equations or formulas, including equations or formulas set forth in ISO 226:2003 (e.g., the equation for deriving sound pressure levels set forth in ISO 226:2003, Section 4.1). In some embodiments, the ALC generation module 122 continuously and/or dynamically generates equal loudness control curves or values thereof.

Figure 3:
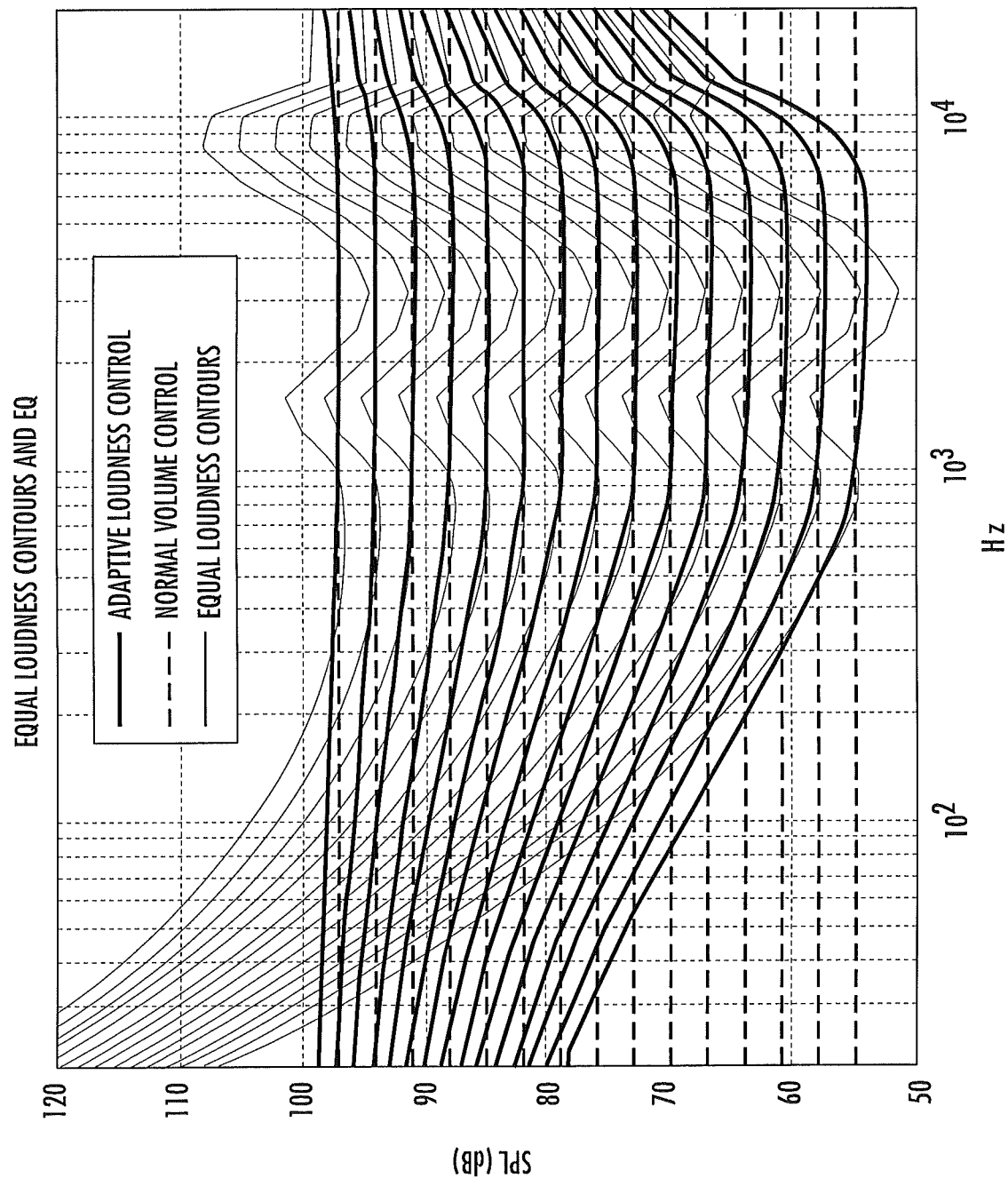
FIG. 3 is a chart showing equal loudness contours, normal volume controls, and adaptive loudness control curves according to some embodiments of the present invention.

Referring to FIG. 3, it can be seen that adaptive loudness control curves (or values thereof) according to embodiments of the invention may be used to control frequency response. As described above, the equal loudness curves illustrate that the human ear typically perceives sounds at their true sound pressure level at 1 kHz. For example, referring to the lowermost equal loudness contour, which corresponds to about 55 phon, the contour intersects the normal volume control line corresponding to about 55 dB at 1 kHz. As such, the human ear perceives a sound pressure level of 55 dB as 55 phon at 1 kHz, and no adaptive loudness control correction or filtering is needed at this frequency, as illustrated by the lowermost adaptive loudness control curve.

The reference sound pressure level may be selectable. It may be based on a sound pressure level or volume level at which the device is known to have a flat frequency response or a substantially flat frequency response. For example, the reference sound pressure level may be selected to be the maximum volume level setting for the device. In some embodiments, the reference sound pressure level is between about 90 dB and 100 dB. In the embodiment shown in FIG. 4, a reference sound pressure level of 94 dB is employed.

Figure 4:
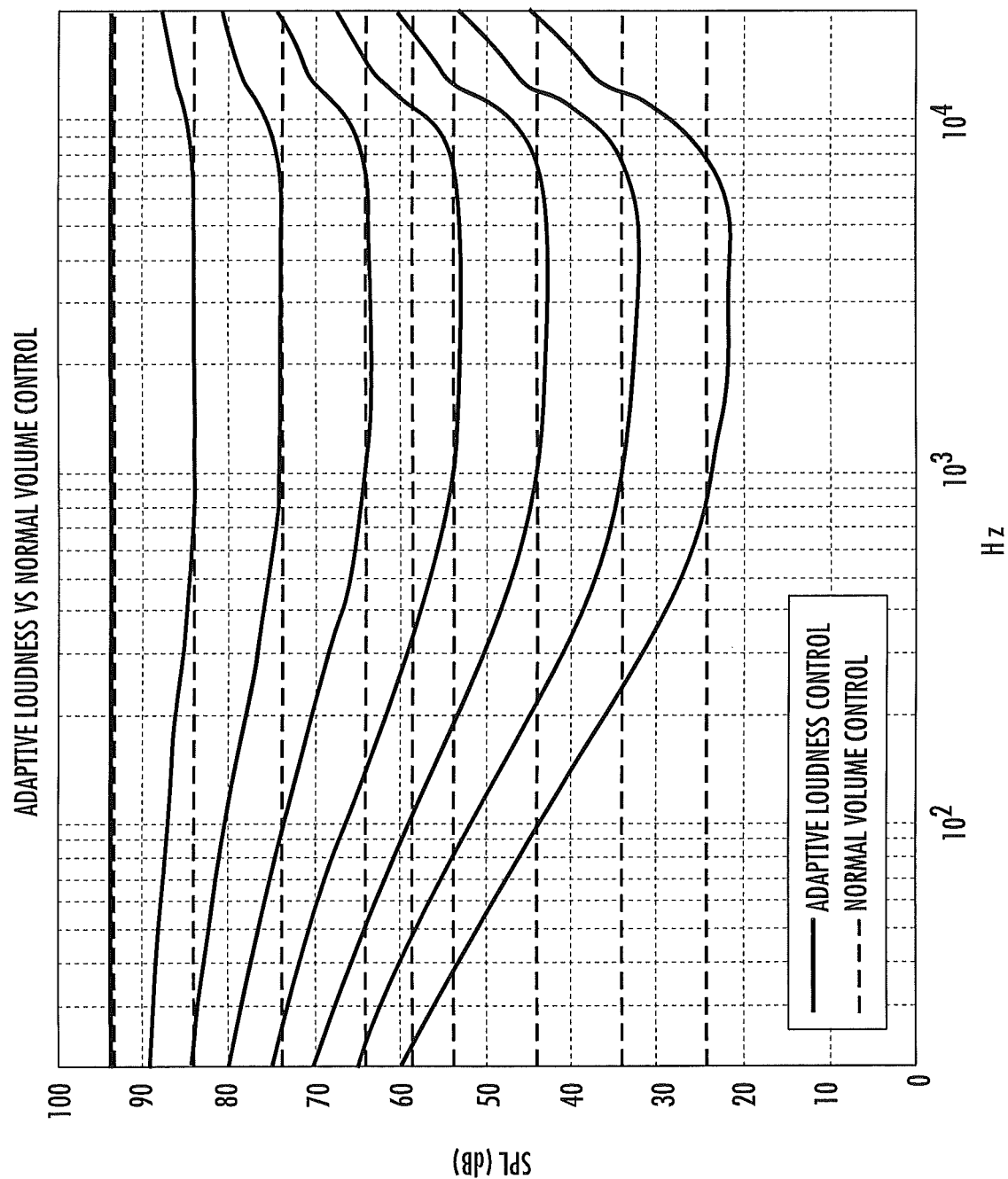
FIG. 4 is a chart showing normal volume controls and adaptive loudness control curves based on a reference sound pressure level of 94 decibels according to some embodiments of the present invention.

A series of adaptive loudness control curves are illustrated in FIG. 4, with each adaptive loudness control curve corresponding an estimated sound pressure level, such as described above in connection with the SPL estimation module 120. Each adaptive loudness control curve may be based on a difference between an equal loudness curve at the reference sound pressure level along a range of frequencies and an equal loudness curve at the estimated sound pressure level along the same range of frequencies. Therefore, in the illustrated embodiment, the uppermost adaptive loudness control curve does not deviate from the normal volume control or sound pressure level of 94 dB.

On the other hand, the other illustrated adaptive loudness control curves do deviate from their corresponding normal volume control or sound pressure level at frequencies other than 1 kHz. The second uppermost adaptive loudness control curve corresponds to an estimated sound pressure level of about 84 dB (again, this sound pressure level may be estimated using the SPL estimation module 120 described above). It can be seen that this particular adaptive loudness control curve deviates from the 84 dB normal volume control or sound pressure level at frequencies away from 1 kHz, indicating that loudness control or filtering is needed at these frequencies. The adaptive loudness control curve moves closer to the reference sound pressure level at decreasing frequencies, indicating the need for increased loudness control or filtering at these low frequencies.

It can also be seen that the adaptive loudness control curves, collectively, converge at lower frequencies. This is due to the non-linearity of human hearing. Specifically, the lower frequencies become more and more attenuated as the sound pressure level is reduced. As such, it can be seen that the lowermost adaptive loudness control curve, corresponding to an estimated sound pressure level of about 24 dB, requires considerably more loudness control or filtering at low frequencies than, for example, the aforementioned estimated sound pressure level of 84 dB.

Furthermore, each adaptive loudness control curve of FIG. 4 does not deviate very much from its corresponding normal volume control or sound pressure level at midrange and upper midrange frequencies because the sound is not overly attenuated at these frequencies, even at relatively low volumes. As a result, it will be appreciated that that the adaptive loudness control curves, collectively, do not converge at these frequencies, but instead remain generally parallel to one another. The adaptive loudness control curves begin to converge again at higher frequencies.

The adaptive loudness control curves according to the illustrated embodiment address issues associated with the non-linearity of human hearing and allow a listener to enjoy a reproduction with an enhanced frequency response (e.g., a flat frequency response or a substantially flat frequency response) independent of volume and content. Specifically, embodiments of the present invention use an approach to address the problem of non-linearity of human hearing by establishing a reference sound pressure level, estimating an actual sound pressure level, and subtracting the values of the equal loudness contour or curve for the reference sound pressure level from the values of the equal loudness contour or curve for the estimated actual sound pressure level over a broad range of frequencies. It is believed that the resulting adaptive loudness control curves can facilitate a substantially flat frequency response and/or improved tonal balance over known techniques.

In some embodiments, the reference sound pressure level may be based on the actual sound pressure level at the time a recording was made. For example, the actual sound pressure level may be supplied with the recording, may be available online, etc. The recording may include data that allows the actual sound pressure level at recording to be extracted, for example by the processor 110. In some embodiments, the processor 110 is configured to determine the actual sound pressure level at the recording. In some embodiments, for example when the actual sound pressure level at recording is supplied with the recording or found online, the processor 110 may receive input (e.g., user input) of the actual sound pressure level at the recording. The processor 110 may use the determined or input actual sound pressure level at recording to establish the reference sound pressure level and to generate adaptive loudness control curves as described herein.

Referring again to FIG. 2, the adaptive loudness processor 110 may include a filtering module 124. The filtering module 124 may be configured to electronically process the audio signal using a set of parameters to provide an audio drive signal to one or more of the other components, including the loudspeaker 118. The filtering module 124 may use the adaptive loudness control curves (or values thereof) generated by the ALC curve generation module 122 to establish filter parameters to provide an improved frequency response (e.g., a flat frequency response or a substantially flat frequency response) from the loudspeaker 118. In some embodiments, the filtering module is configured to generate a set of filter coefficients based on values of one or more adaptive loudness control curves generated by the ALC curve generation module 122 such that the audio signal may be filtered according to the generated set of filter coefficients.

One or more of the SPL estimation module 120, the ALC curve generation module 122 and/or the filtering module 124 may be omitted or integrated with one another without departing from the teachings of the present invention. Further, although only one controller or processor is shown in FIG. 2 in the form of the adaptive loudness processor 110, it will be understood that additional and/or alternative controllers or processors may be employed as part of the electronic device 100. For example, there may be a controller associated with the filter 112, with such controller configured to receive the audio signal, the applicable adaptive loudness control curve(s) or values thereof, and/or the applicable filter coefficients or parameters from the processor 110. The controller associated with the filter 112 may then electronically process the audio signal using the received signals or data, and control the filter 112 to filter the audio signal accordingly.

As described above, one or more attributes or settings of the electronic device 100 and/or the audio signal may be used to estimate the sound pressure level of the audio signal and/or the "actual" sound pressure level as it would be output from the loudspeaker 118. As shown in the example above, a volume setting 132 that controls operation of the electronic device 100 may be one of the attributes or settings of the electronic device 100. As shown in FIG. 4, a different filter curve is applied for each volume step. Again, a reference sound pressure or volume level is applied; in FIG. 4 the reference level of 94 dB is selected (this may be full volume). No filtering is applied at the reference level. Adaptive loudness control curves (or filter curves) for lower volume settings are extracted as the difference between the equal loudness curve at the reference level or 94 dB and the equal loudness curve for the amount of attenuation applied by the volume control. It will be understood that a device or system may have more than one volume control, and that the loudness curve may be based on the amount of attenuation for all volume controls used.

Content attribute(s) 134 may be one of the attributes or settings of the audio signal used to estimate the sound pressure level. For example, the type of audio signal, such as the type of the recording or the type of received signal may be identified. Additionally or alternatively, the audio signal may be analyzed and/or monitored to determine the level of content. In practice, changes in perceived relative spectral balance among low, middle and high frequencies depend on the signal, and in particular on its actual spectrum and on whether it is intended to be loud or soft. For example, consider the recording of a symphony orchestra. Reproduced at the same level that a member of the audience would hear in a concert hall, the balance across the spectrum may be correct whether the orchestra is playing loudly or quietly. If the music is reproduced 10 dB quieter, however, the perceived balance across the spectrum changes in one manner for loud passages and changes in another manner for quiet passages. A conventional passive loudness control does not apply different compensations as a function of the content (e.g., music). In some embodiments, the processor 110 or the SPL estimation module 120 thereof (FIG. 2) is configured to analyze the audio signal to estimate the sound pressure level. The audio signal may be analyzed (e.g., continuously analyzed to get a time based average input to the audio chain.

The gain of the audio chain 136 may be one of the attributes or settings of the electronic device 100 used to estimate the sound pressure level. For example, the gain of the amplifier 116 may be known or determined and provided as an input for the estimation of sound pressure level. The gain of more than one component in the audio chain, such as the filter 112, the D/A converter 114, the amplifier 116 and/or the loudspeaker 118 may be known or determined and used as an input for the estimation of sound pressure level.

Attributes of digital-to-analog conversion of the audio signal, for example of the D/A converter 114, may be one of the attributes or settings of the electronic device 100 and/or the audio signal used to estimate the sound pressure level. For example, a transducer factor associated with the D/A converter 114 (i.e., the output voltage per bit of digital content)

may be known or may be analyzed or monitored (e.g., by the processor 110 or some other processor or controller) to determine its effect on sound pressure level. The transducer factor may be monitored continuously and/or dynamically.

The efficiency of the loudspeaker 118 may be one of the attributes or settings of the electronic device 100 used to estimate the sound pressure level. The efficiency of the loudspeaker 118 may be known or identified, for example using the methods and systems described in U.S. Patent Application Publication No. 2013/0044888, the disclosure of which is hereby incorporated by reference in its entirety. With the efficiency of the loudspeaker 118 known or identified, the transmission factor from electric output to sound pressure level is known or may be determined. Although only one loudspeaker 118 is shown in FIG. 2, it will be understood that the device 100 may include two or more loudspeakers, and that the transmission factor for each loudspeaker or a collective transmission factor may be used as an input to estimate the sound pressure level.

Characteristics of a microphone signal 142 may be one of the attributes or settings of the audio signal used to estimate the sound pressure level. For example, a microphone (not shown) may be positioned on the device 100 or in the environment in which the device 100 is outputting audio. The microphone may provide feedback signals to a processor of the device 100. For example, the microphone may provide feedback signals related to the audio output from the loudspeaker 118 to the SPL estimation module 120.

Referring to FIG. 2, more than one of the attributes or settings of the electronic device and/or the audio signal or "input parameters" 130 may be used to estimate the sound pressure level. In some embodiments, more than one of the above-described attributes or settings of the electronic device and/or the audio signal may be used to estimate the sound pressure level with increased accuracy.

Figure 5:
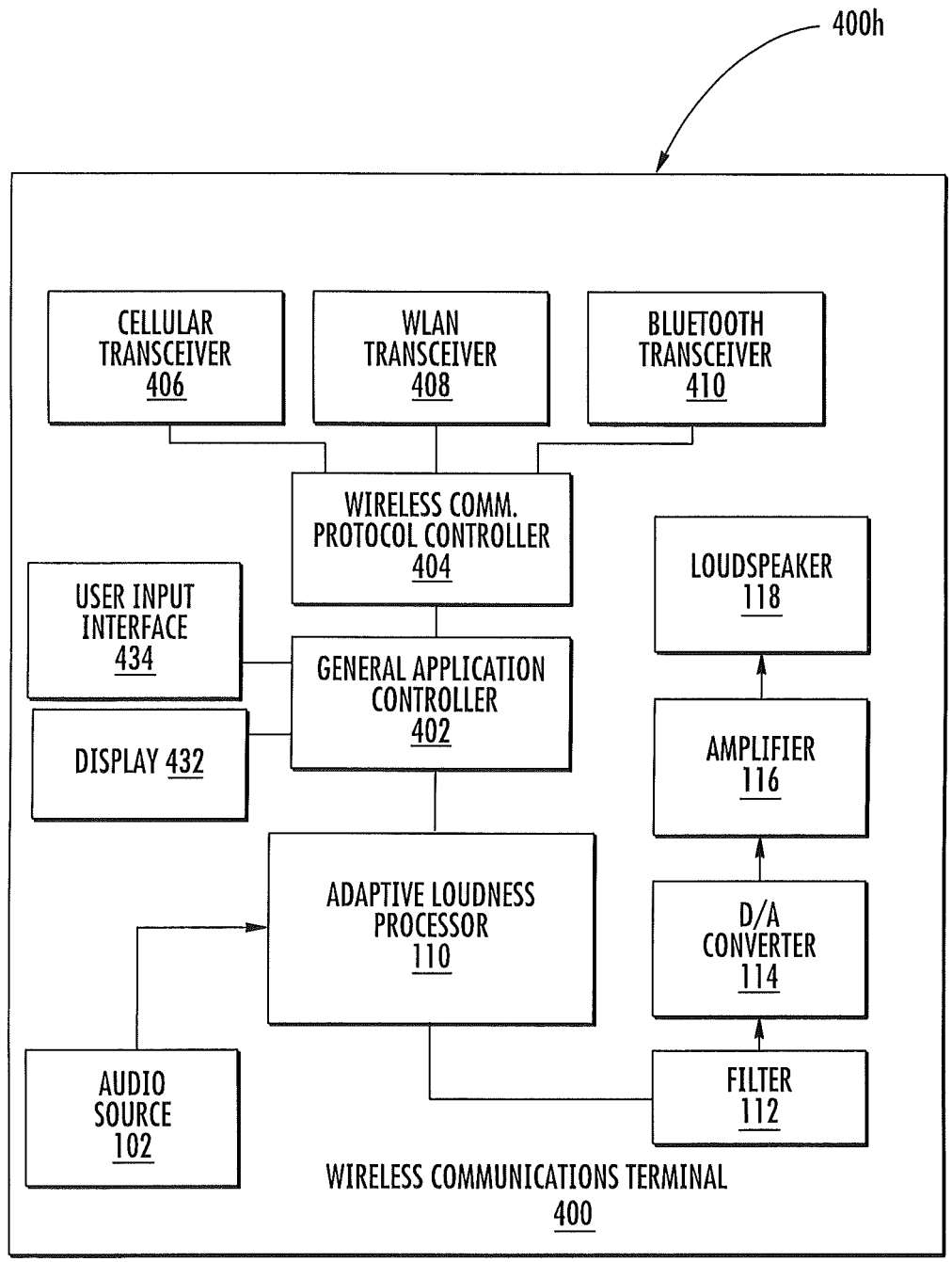
FIG. 5 is a block diagram of a communication terminal and exemplary components thereof according to some embodiments of the present invention.

In some embodiments, the electronic device 100 takes the form of a mobile wireless communications terminal. FIG. 5 is a diagram of a terminal 400 that includes a terminal housing 400h, The illustrated terminal 400 includes a display 432 and a user input interface 434 (e.g., a keypad or touchscreen). The illustrated terminal further includes a general application controller 402, a wireless communication protocol controller 404, a cellular transceiver 406, a WLAN transceiver 408 (e.g., compliant with one or more of the IEEE 801.11a-g standards), and/or a Bluetooth transceiver 410.

The cellular transceiver 406 can be configured to communicate bi-directionally according to one or more cellular standards, such as Long Term Evolution (LTE), enhanced data rates for General Packet Radio Service (GPRS) evolution (EDGE), code division multiple access (CDMA), wideband-CDMA, CDMA2000, and/or Universal Mobile Telecommunications System (UMTS) frequency bands. The terminal 400 may thereby be configured to communicate across a wireless air interface with a cellular transceiver base station and with another terminal via the WLAN transceiver 408 and/or the Bluetooth transceiver 410.

As illustrated in FIG. 5, the terminal 400 may include the components described above in connection with the device 100, including the audio source 102, the adaptive loudness processor 110, the filter 112, the D/A converter 114, the amplifier 116, and/or the loudspeaker 118. One or more of these components may be omitted from the terminal 400 and/or rearranged within the terminal 400, and it is contemplated that additional components (e.g., one or more additional controllers or processors) may be included.

Figure 6:
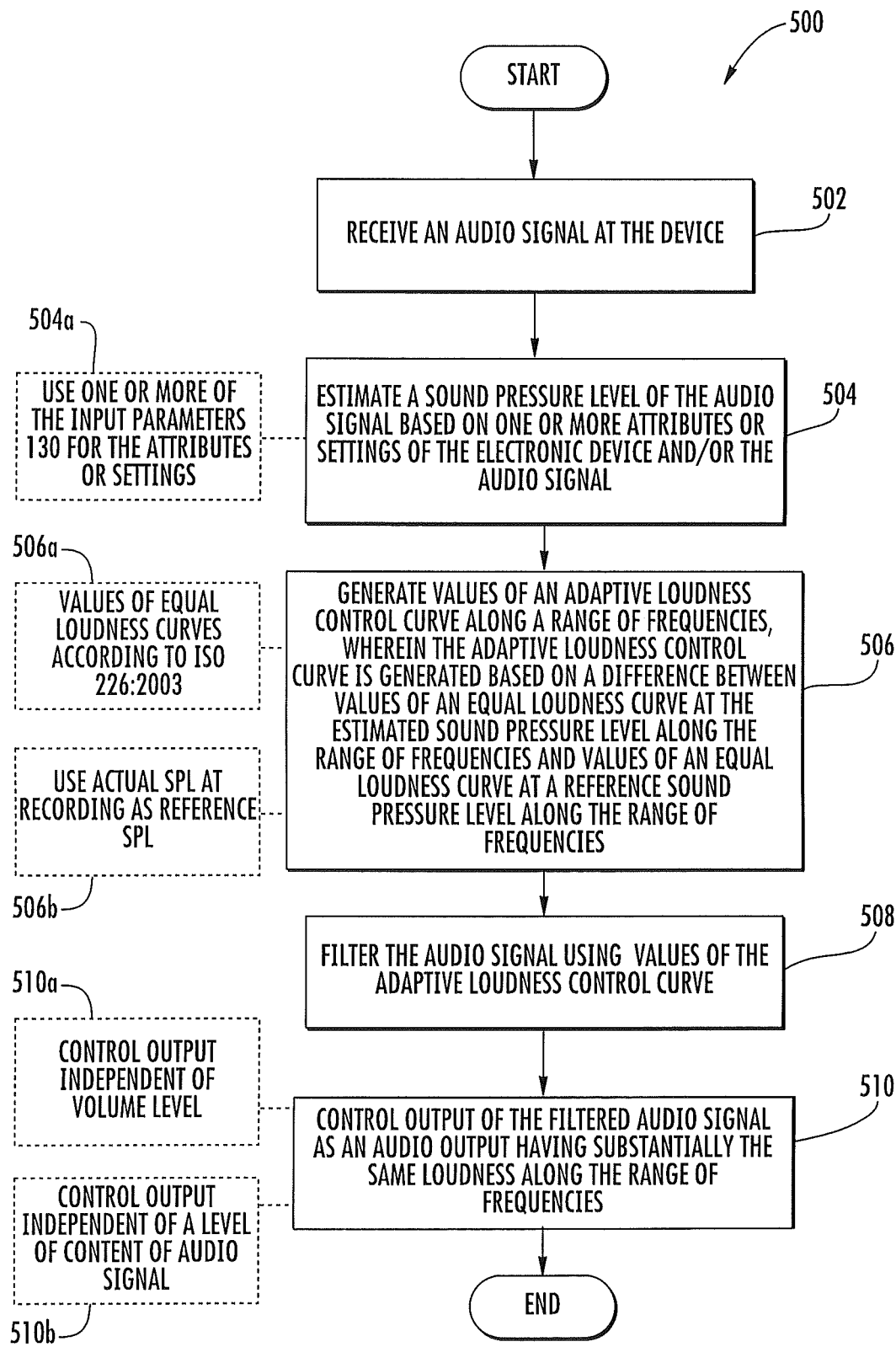
FIG. 6 is a flowchart of methods and operations that may be carried out for controlling a frequency response for audio output by an electronic device.

Exemplary operations according to embodiments of the invention are illustrated in FIG. 6. A method 500 by an electronic device for controlling a frequency response of audio output includes receiving an audio signal at the device (Block 502). A sound pressure level of the audio signal is estimated based on one or more attributes or settings of the electronic device and/or the audio signal (Block 504). The attributes or settings of the electronic device and/or the audio signal may be one or more of the attributes or settings described above with reference to the input parameters 130 (Block 504a).

An adaptive loudness control curve or values thereof is generated along a range of frequencies (Block 506). The adaptive loudness control curve is generated based on a difference between values of an equal loudness curve at the estimated sound pressure level along the range of frequencies and values of an equal loudness curve at a reference sound pressure level along the range of frequencies. In some embodiments, values of the equal loudness curve at the estimated sound pressure level and values of the equal loudness curve at the reference sound pressure level are values of equal loudness curves according to ISO 226:2003 (Block 506a). In some embodiments, the actual sound pressure level at the time of recording is known or determined from the recording, and the actual sound pressure level at recording is used as the reference sound pressure level (Block 506b). The reference sound pressure level may be established and/or set in other ways as described above.

The audio signal is filtered using the adaptive loudness control curve (Block 508). In some embodiments, the method includes generating a set of filter coefficients based on values of the adaptive loudness control curve and filtering the audio signal according to the generated set of filter coefficients.

The method 500 further includes controlling output of the filtered audio signal as an audio output having substantially the same loudness along the range of frequencies (Block 510). The output may be controlled independent of volume level (Block 510a) and/or independent of a level of content of the audio signal (Block 510b).

It will be appreciated that these operations may be carried out using the devices and components described above. It will also be appreciated that additional operations are contemplated, including those described above in connection with the described devices and components.

As set forth above, the devices and methods according to embodiments of the present invention may advantageously facilitate audio output with improved frequency response and/or tonal balance. Embodiments of the present invention may allow a user to get closer to the ultimate audio experience by automatically getting the same tonal balance independent of volume and/or content levels. Embodiments of the present invention may also facilitate enhanced acoustic safety. Many users tend to play music at high sound pressure levels in an effort to improve the frequency response and/or the tonal balance. When the frequency response and/or the tonal balance is correct independent of level, there is no longer the need to play at high sound pressure levels.

Many alterations and modifications may be made by those having ordinary skill in the art, given the benefit of present disclosure, without departing from the spirit and scope of the invention. Therefore, it must be understood that the illustrated embodiments have been set forth only for the purposes of example, and that it should not be taken as limiting the invention as defined by the following claims. The following claims, therefore, are to be read to include not only the combination of elements which are literally set forth but all equivalent elements for performing substantially the same function in substantially the same way to obtain substantially the same result. The claims are thus to be understood to include what is That which is claimed is:

1. A method by an electronic device for controlling a frequency response of audio output, the method comprising:
   receiving an audio signal at the device;
   estimating a sound pressure level of the audio signal based on one or more attributes or settings of the electronic device and/or the audio signal;
   generating values of an adaptive loudness control curve along a range of frequencies, wherein the adaptive loudness control curve is generated based on a difference between values of an equal loudness curve at the estimated sound pressure level along the range of frequencies and values of an equal loudness curve at a reference sound pressure level along the range of frequencies, wherein the device has a substantially flat frequency response at the reference sound pressure level;
   filtering the audio signal using values of the adaptive loudness control curve; and
   controlling output of the filtered audio signal as an audio output having substantially the same loudness along the range of frequencies.

2. The method of claim 1, wherein values of the equal loudness curve at the estimated sound pressure level and values of the equal loudness curve at the reference sound pressure level are values of equal loudness curves according to ISO 226:2003.

3. The method of claim 1, comprising controlling the output of the filtered audio signal as an audio output having substantially the same loudness along the range of frequencies independent of volume level.

4. The method of claim 1, comprising controlling the output of the filtered audio signal as an audio output having substantially the same loudness along the range of frequencies independent of a level of content of the audio signal.

5. The method of claim 1, comprising:
   generating a set of filter coefficients based on values of the adaptive loudness control curve; and
   filtering the audio signal according to the generated set of filter coefficients.

6. The method of claim 1, wherein the one or more attributes or settings of the electronic device and/or the audio signal includes a volume setting that controls operation of the electronic device.

7. The method of claim 1, comprising determining a transducer factor associated with digital to analog conversion of the audio signal following the filtering, wherein the one or more attributes or settings of the electronic device and/or the audio signal includes the determined transducer factor.

8. The method of claim 1, comprising determining a gain that controls operation of at least one component of the electronic device, wherein the one or more attributes or settings of the electronic device includes the determined gain of the at least one component of the electronic device, wherein the at least one component of the electronic device includes at least one of an amplifier, a digital to analog converter, a processor, a filter and a loudspeaker.

9. The method of claim 1, wherein the one or more attributes or settings of the electronic device and/or the audio signal includes a level of the audio signal.

10. The method of claim 9, wherein the audio signal comprises a received or recorded signal, the method further comprising analyzing the received or recorded signal to obtain a time based average audio input as the level of the audio signal.

11. The method of claim 1, wherein the one or more attributes or settings of the electronic device and/or the audio signal includes an efficiency of a loudspeaker of the electronic device.

12. The method of claim 1, wherein the one or more attributes or settings of the electronic device and/or the audio signal comprises characteristics of a microphone signal.

13. The method of claim 1, wherein the reference sound pressure level is between about 90 dB and 100 dB.

14. The method of claim 1, wherein the reference sound pressure level corresponds to a maximum volume level for the device.

15. The method of claim 1, wherein generating values of an adaptive loudness control curve comprises generating values of an adaptive loudness control curve along a range of frequencies including frequencies above 1 kHz.

16. An electronic device comprising:
   an audio source;
   a loudspeaker; and
   at least one processor configured to:
     receive an audio signal from the audio source;
     estimate a sound pressure level of the audio signal based on one or more attributes or settings of the electronic device and/or the audio signal;
     generate values of an adaptive loudness control curve along a range of frequencies, wherein the adaptive loudness control curve is generated based on a difference between values of an equal loudness curve at the estimated sound pressure level along the range of frequencies and values of an equal loudness curve at a reference sound pressure level along the range of frequencies, wherein the reference sound pressure level corresponds to a maximum volume level for the device; and
     adaptively filter the audio signal using values of the generated adaptive loudness control curve;
   wherein the loudspeaker is configured to output the filtered audio signal as an audio output having substantially the same loudness along the range of frequencies.

17. The device of claim 16, further comprising a filter and for filtering the audio signal using values of the generated adaptive loudness control curve.

18. The device of claim 16, wherein the at least one processor is configured to electronically process the audio signal using a set of parameters that include electronic frequency response correction that is based on values of the generated adaptive loudness control curve to provide an audio drive signal to the loudspeaker.

19. The device of claim 16, wherein the device is a wireless communications terminal.

20. A computer program product for controlling frequency response for audio output by an electronic device, the computer program product comprising a non-transitory computer readable storage medium having encoded thereon instructions that, when executed on a computer, cause the computer to:
   estimate a sound pressure level associated with an audio signal received at the electronic device based on one or more attributes or settings of the electronic device and/or the audio signal;
   generate values of an adaptive loudness control curve along a range of frequencies, wherein the adaptive loudness control curve is generated based on a difference between values of an equal loudness curve at the estimated sound pressure level along the range of frequencies and values of an equal loudness curve at a reference sound pressure level along the range of frequencies, wherein the device has a substantially flat frequency response at the reference sound pressure level;
filter the audio signal using values of the adaptive loudness control curve; and
control output of the filtered audio signal as an audio output having substantially the same loudness along the range of frequencies.

* * * * *

UNITED STATES PATENT AND TRADEMARK OFFICE
CERTIFICATE OF CORRECTION

PATENT NO. : 9,253,586 B2  
APPLICATION NO. : 13/871260  
DATED : February 2, 2016  
INVENTOR(S) : Nystrom et al.

Page 1 of 1

It is certified that error appears in the above-identified patent and that said Letters Patent is hereby corrected as shown below:

In the Claims:
Column 12, Claim 17, Lines 41 - 42: Please correct "a filter and for filtering"
to read -- a filter for filtering --

Signed and Sealed this
Twelfth Day of July, 2016

Michelle K. Lee
*Director of the United States Patent and Trademark Office*